(12) United States Patent
Cheng

(10) Patent No.: US 9,103,659 B1
(45) Date of Patent: Aug. 11, 2015

(54) METHOD AND SYSTEM FOR JUNCTION DEPTH IDENTIFICATION FOR ULTRA SHALLOW JUNCTIONS

(71) Applicant: TSMC Solar Ltd., Taichung (TW)

(72) Inventor: Tzu-Huan Cheng, Kaohsiung (TW)

(73) Assignee: TSMC Solar Ltd., Taichung (TW)

( * ) Notice: Subject to any disclaimer, the term of this patent is extended or adjusted under 35 U.S.C. 154(b) by 0 days.

(21) Appl. No.: 14/191,475

(22) Filed: Feb. 27, 2014

(51) Int. Cl.
*G01B 11/06* (2006.01)
*G01N 21/33* (2006.01)
*G01N 21/35* (2014.01)
*G01B 11/02* (2006.01)

(52) U.S. Cl.
CPC ............ *G01B 11/0625* (2013.01); *G01B 11/02* (2013.01)

(58) Field of Classification Search
CPC .... G01B 11/02; G01B 11/06; G01B 11/0625; G01N 21/33; G01N 21/35; G01N 21/3563
See application file for complete search history.

(56) References Cited

U.S. PATENT DOCUMENTS

| | | | |
|---|---|---|---|
| 2003/0209651 A1* | 11/2003 | Iwasaki | 250/214.1 |
| 2010/0165165 A1* | 7/2010 | Luo et al. | 348/308 |
| 2013/0194577 A1* | 8/2013 | Bogdanowicz | 356/447 |

* cited by examiner

*Primary Examiner* — Mark R Gaworecki
(74) *Attorney, Agent, or Firm* — Duane Morris LLP

(57) ABSTRACT

Provided is a method for identifying material junctions and doping characteristics in semiconductor and other materials by illuminating the material and measuring voltage. A correlation between penetration depth of light and wavelength of light is established for a material. Photons are applied to materials such as semiconductor materials to induce charge. The photons are applied by exposing the material to light having a range of wavelengths. The induced charge results in a measurable voltage. The voltage is measured and the voltage measurements used to determine a junction depth and charge concentration of a material using the correlation between penetration depth of light and wavelength of light.

20 Claims, 5 Drawing Sheets

METHOD AND SYSTEM FOR JUNCTION DEPTH IDENTIFICATION FOR ULTRA SHALLOW JUNCTIONS

BACKGROUND

The disclosure relates most generally to semiconductor devices and solar cell devices and more particularly to methods for identifying, locating and characterizing junctions between different materials or junctions between regions having different doping characteristics.

As technology advances, semiconductor integrated circuit devices, solar cells, other semiconductor devices and various other devices are being formed to smaller and smaller dimensions. Many devices are scaled down to the nanometer scale.

Particularly within this regime, the various device features must be accurately formed and positioned. It is important to identify the dimensions and locations of such features using reliable and accurate measurement techniques. For example, it is desirable to identify the junction or interface between various different materials or between various regions having different dopant characteristics. P-n junctions are the active sites where the electronic action of device takes place and represents one such junction. It is useful to identify the location of these junctions, but this becomes increasingly challenging as dimensions become reduced. Non-destructive, accurate and rapid measurement techniques are needed.

BRIEF DESCRIPTION OF THE DRAWINGS

Aspects of the present disclosure are best understood from the following detailed description when read in conjunction with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
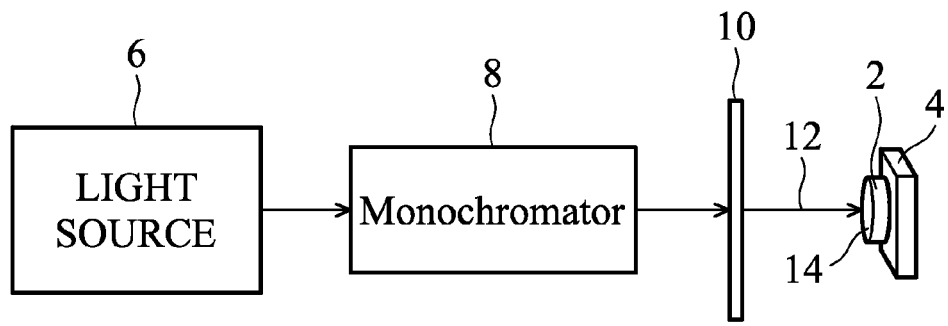
FIG. 1 is a schematic diagram showing a light source illuminating a sample in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and solar cell devices continue to be scaled-down to smaller dimensions, and this scaling-down plays a key role in the fabrication process that enables the production of high performance, low cost and low power consumption devices. Devices with nanometer-scale features are now being produced and utilized and it is especially important, in the nanometer range, to have reliable process control of the fabrication processes and of the device features they produce. It is important to be able to accurately determine the location and dimensions of device features and to understand the characteristics of such features.

Multiple p-n, MOS (metal-oxide-semiconductor) and other MIS (metal-insulator-semiconductor) junctions/interfaces are common and important features present in such devices, and the control and characterization of such junctions/interfaces is an important aspect of process control and of device control. A p-n junction is a boundary or interface between two types of semiconductor materials, p-type and n-type, inside a single crystal of semiconductor. The p-n junction is created by doping, for example by ion implantation, diffusion of dopants, or by epitaxy, i.e. growing a layer of crystal doped with one type of dopant on top of a layer of crystal doped with another type of dopant, or by other means. P-n junctions are the active sites where the electronic action of the device takes place. P-n junctions are elementary building blocks of most semiconductor electronic devices such as diodes, transistors, solar cells, LEDs, and integrated circuits.

The characterization of such junctions/interfaces is important and continues to be important as the dimensions of the devices continue to shrink. The location of such junctions/interfaces is important because their location affects device functionality. Oftentimes, the location of such an interface or a junction is described in reference to a substrate surface beneath which the junction/interface is disposed. As such, "junction depth" is a term used to identify the depth beneath a surface at which a p-n or other junction is disposed.

The optical absorption of semiconductor material and other materials is sensitive to photon energy. The depth to which light penetrates a material such as a semiconductor material, is dependent upon the type of material and the wavelength of light used. Light with shorter wavelengths is higher energy light that is absorbed quickly, and therefore has a shallower penetration depth. Conversely, light with higher wavelengths is lower energy light that penetrates deeper into a material.

The present disclosure includes a method in which photons are applied to materials such as semiconductor materials, to induce charge. The photons are applied by exposing the material to light having a range of wavelengths. The induced charge results in a measurable voltage. The voltage is measured and the voltage measurements used to determine a junction depth and charge concentration of a material.

More particularly, the disclosure provides for first establishing a correlation between penetration depth of light and wavelength of light for a material. A plot is generated in some embodiments, with the plot associating each wavelength of radiation with a particular penetration depth. This correlation is useful in determining a junction depth for a junction between regions formed in a substrate formed of the material.

A substrate material is then analyzed using the correlation. The substrate is formed of the material and has a junction located at a depth beneath its surface. The substrate is illuminated. In particular, the substrate surface is exposed to light radiation having a range of wavelengths.

The voltage across the junction or interface is then measured as a function of wavelength of light, and the peak voltage is identified. The peak voltage is the voltage at the p-n junction and is indicative of the location of the p-n junction and the quantity of light energy absorbed at the p-n junction. More particularly, in some embodiments a plot of measured voltage versus wavelength associates a measured voltage with each wavelength of light. The peak voltage of this data curve is associated with a particular wavelength and that wavelength can be used, in conjunction with the established penetration depth versus wavelength correlation, to identify the junction depth, i.e. the depth of the junction beneath the surface through which the illumination is provided. The peak voltage is also indicative of various other doping characteristics associated with the p-n junction. Higher carrier concentration contributes to higher voltage value and lower carrier concentration results in lower voltage value. As such, a higher peak voltage signal is indicative of a higher carrier concentration in the material under evaluation.

FIG. 1 is a schematic diagram showing an arrangement in accordance with embodiments of the disclosure. Substrate material 2 is a solar cell in some embodiments, and in some embodiments, substrate material 2 is a CIGS (carbon indium gallium selenide) absorber layer disposed on or over a solar cell substrate. In other embodiments, substrate material 2 is a semiconductor material such as silicon, silicon germanium, or germanium, but other materials are used in other embodiments. In still other embodiments, substrate material 2 is a layer of material formed over a substrate formed of a semiconductor such as silicon, silicon germanium, or germanium, but other materials are used in other embodiments. Substrate material 2 is exposed to illumination of different wavelengths as shown in FIG. 1.

During the exposure to the illumination of various wavelengths, substrate material 2 is retained by holder 4. Holder 4 is a chuck, base, or other retaining member capable of retaining substrate material 2 during an illumination process. Light source 6 is produces light having a range of wavelengths. Various suitable and capable light sources are used in various embodiments. Monochromator 8 isolates the individual wavelengths of light and allows each to pass to substrate material 2. Various monochromators are used and in some embodiments, a grating monochromator is used, but other monochromators are used in other embodiments. Frequency modulator 10 is used in some embodiments to apply a specific frequency of the light. The frequency modulator modulates the frequency of light and the frequency ranges from about 1 to 2000 Hz in various embodiments. In various embodiments, the duty cycle of the modulation ranges from about 10 to about 90%. In some embodiments, the frequency modulator is included within a modulated power controller. The modulated power controller applies a high/low power output that results in a high/low illumination intensity of light, for specific frequencies of light, in some embodiments. In other embodiments, frequency modulator 10 is not used. In the arrangement of FIG. 1, each of the various wavelengths within a range of wavelengths of illumination, passes individually to substrate material 2. Radiation 12 reaches surface 14 of substrate material 2 and passes into and is absorbed by substrate material 2. Radiation 12 includes a wide range of wavelengths, ranging from ultraviolet (uv), to infrared (ir) radiation in various embodiments.

The arrangement of FIG. 1 for illuminating a substrate is used to both establish a correlation between wavelength and depth of light penetration, and also to measure voltage versus wavelength of light and establish a correlation between wavelength and measured voltage.

In establishing a correlation between wavelength and depth of light penetration, different ranges of wavelengths of light are used in various embodiments, depending on the material of substrate material 2. The wavelength of radiation 12 directed to substrate material 2 varies from 200 nm to 2000 nm in various embodiments but other ranges are used in other embodiments. According to an embodiment in which substrate material 2 is formed of silicon, the range of wavelength of light varies from 200-1200 nm according to some embodiments but other ranges are used in other embodiments. According to an embodiment in which substrate material 2 is formed of germanium, the range of wavelength of light varies from 200-1700 nm according to some embodiments but other ranges are used in other embodiments. According to an embodiment in which substrate material 2 is formed of SiGe, the range of wavelength of light varies from 200-2000 nm according to some embodiments but other ranges are used in other embodiments. According to an embodiment in which substrate material 2 is formed of a III-V compound semiconductor, the range of wavelength of light varies from 200-900 nm according to some embodiments.

Still referring to FIG. 1, various suitable light sensors and voltage sensors are coupled to substrate material 2 and are also coupled to a computer or other processor in various embodiments. In some embodiments, an amplifier is used to amplify the voltage signal. In some embodiments, the amplifier is a lock-in amplifier that reduces background noise of the voltage signal.

According to various aspects of the disclosure, a number of trials are carried out on the substrate material of interest to generate a correlation between penetration depth and wavelength of light. In other embodiments, this relationship, i.e. correlation, is simulated using various suitable computers and processors running various simulation routines.

Figure 2:
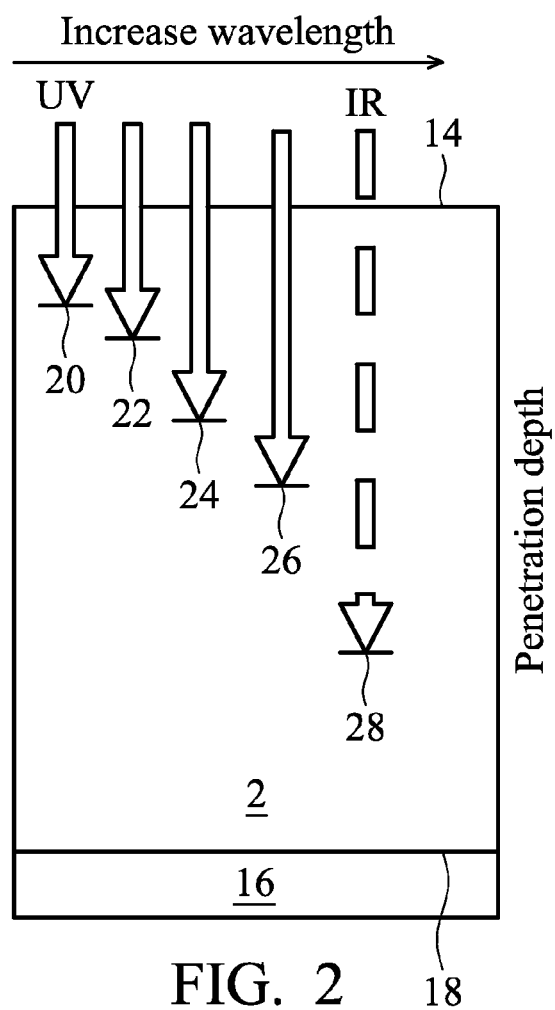
FIG. 2 is a cross-sectional and schematic view showing different wavelengths of light penetrating to different depths in a sample, in accordance with some embodiments.
Figure 3:
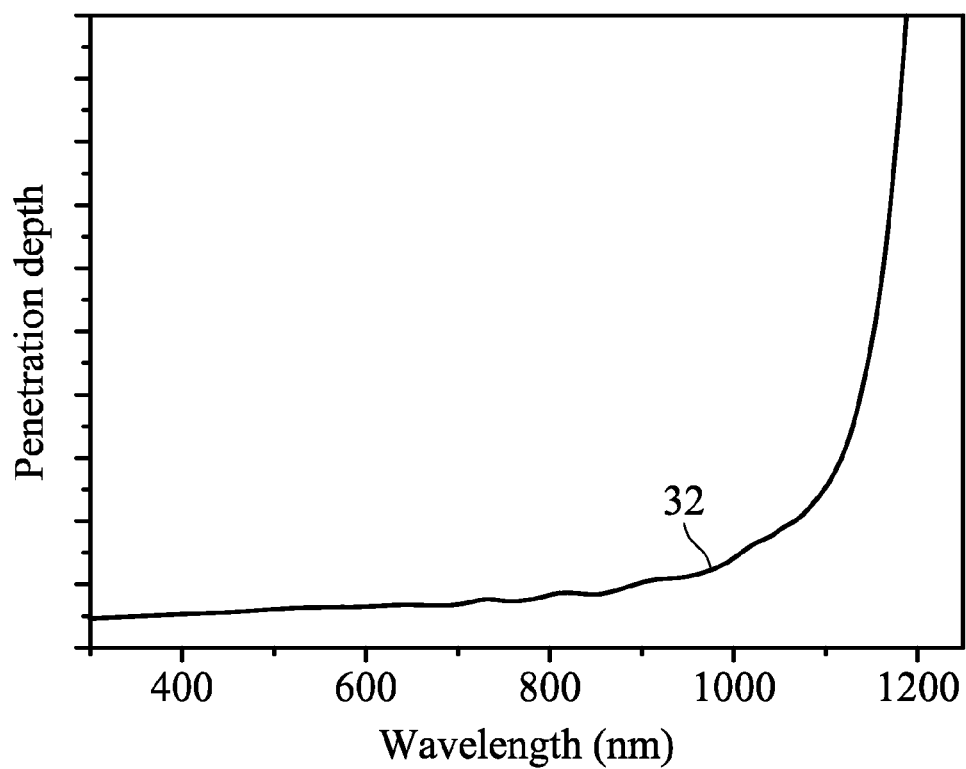
FIG. 3 is an embodiment showing a graphical representation of penetration depth versus wavelength, for light in a material, in accordance with some embodiments.

FIG. 2 is a schematic showing various penetration depths of various wavelengths of light in a material. Substrate material 2 includes surface 14 and further material 16 is formed along opposed surface 18 of substrate material 2. In one embodiment, substrate material 2 is a CIGS absorber layer and further material 16 is Mo, but various other materials are used in other embodiments. FIG. 2 shows light having various wavelengths ranging from ultraviolet (less than about 400 nm) to infrared (greater than about 1500 nm). FIG. 2 shows only five different wavelengths of light extending through surface 14 and to different depths 20, 22, 24, 26 and 28. It should however be understood that the various other wavelengths of light in the uv-visible-ir spectrum, extend to different depths though not illustrated in FIG. 2. As above, infrared radiation is a lower energy, higher wavelength radiation that goes further into substrate material 2, i.e. to depth 28 than does ultraviolet radiation, which is a higher energy, lower wavelength radiation and extends to a lesser depth 20 into substrate material 2. FIG. 2 shows that light penetrates deeper into a material as the wavelength of the light increases. Within an absorber, the existing light intensity (I) at any location is described by $I=I_0 \cdot e^{-\alpha(\lambda)d}$, in which a is the material absorption coefficient and d is penetration depth. As such, the transmittance measurement is used to determine penetration depth in some embodiments and various methods of measuring light transmittance may be used. Various trials or other methods of establishing correlations are carried out to associate a wavelength of light with a penetration depth and to produce the correlation such as shown in FIG. 3. Various other methods or calculations are used to determine penetration depth in other embodiments.

FIG. 3 shows curve 32, which represents a plot of wavelength versus penetration depth for a material in accordance with some embodiments of the disclosure. The curve 32 in FIG. 3 represents one example only, and various other correlations, indicated by various other curves, are generated in other embodiments.

According to aspects of the disclosure, a correlation between wavelength and penetration depth, such as shown in FIG. 3 and indicated by curve 32, is established for a material of interest. Within an absorber material, the existing light intensity (I) at any location is described by $I=I_0 \cdot e^{-\alpha(\lambda)d}$, in which a is the material absorption coefficient and d is penetration depth. When $d=(1/\alpha(\lambda))$, $I=0.37 \cdot I_0$ so, for any material in which a is known, the existing light intensity (I) can be measured and the penetration depth, d, can be determined for various wavelengths. Various methods for measuring transmittance are available and can be used. In some embodiments, a transmittance spectroscope is used to measure transmittance and penetration depth. The penetration depth, d, is then known as a function of wavelength and the wavelength versus penetration depth correlation such as illustrated graphically in FIG. 3, can be established.

Once the wavelength versus penetration depth correlation is established, a sample formed of the material of interest and having a junction beneath its surface can then be analyzed. In some embodiments the sample is a solar cell substrate or a semiconductor substrate and includes a test pattern used for junction identification for in-line monitoring but other structures including the sample are used in other embodiments. In some embodiments the sample is a layer formed on a solar cell substrate or a semiconductor substrate and in some embodiments, the sample is the solar cell substrate or a semiconductor substrate itself. The sample is analyzed using non-destructive light radiation to determine the depth of the junction, i.e. the distance between the junction and the surface through which the illuminating light enters the substrate. The arrangement shown in FIG. 1 may be used for the analysis.

Figure 4A:
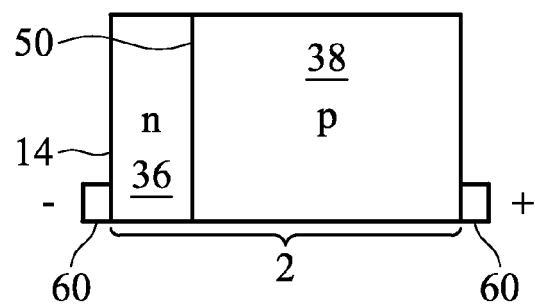
FIGS. 4A, 4B, 4C are cross-sectional views, each showing a sample with a p-n junction and electrodes positioned for measuring voltage, in accordance with some embodiments.
Figure 4B:
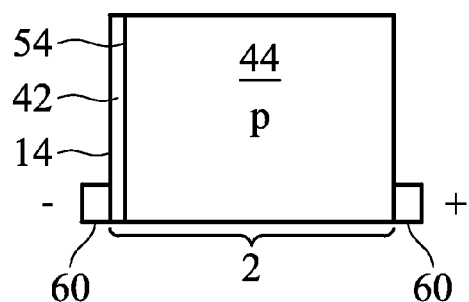
Figure 4C:
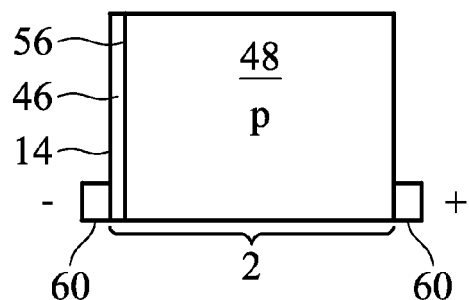

FIGS. 4A-4C show various embodiments of junctions such that may be measured and identified according to various aspects of the disclosure. Substrate material 2 can be various types of semiconductor materials and includes a junction beneath its surface. The junction is a p-n junction in the illustrated embodiments, but it should be understood that in other embodiments, the junction is an MOS or MIS junction, i.e. a junction between different materials or different dopant regions. In FIG. 4A, substrate material 2 includes n-doped region 36 and p-doped region 38. In FIG. 4B, substrate material 2 includes n-doped material 42 and p-doped material 44, and in FIG. 4C, substrate material 2 includes n-doped material 46 and p-doped material 48. In FIG. 4A, junction 50 is disposed between n-doped material 36 and p-doped material 38. In FIG. 4B, junction 54 is disposed between n-doped material 42 and p-doped material 44, and in FIG. 4C, junction 56 lies between n-doped material 46 and p-doped material 48.

The disclosure provides for determining the location of the respective junctions 50, 54 and 56, in particular, the distance of respective junctions 50, 54 and 56 from surface 14, by introducing illumination into surface 14 and measuring voltage. This distance is frequently referred to as the junction depth, i.e. the depth of respective junctions 50, 54 and 56 beneath surface 14. In each of the illustrated embodiments, two electrodes 60 are coupled to negative and positive sides of the p-n junction and are used to measure voltage across the p-n junction when substrate material 2 is illuminated by light directed through surface 14. The light directed through surface 14 includes a range of wavelengths appropriate for the substrate material 2, some examples of which were provided above. Various voltage meters are used in various embodiments. In some embodiments in which the n and p-doped materials are formed in a solar cell substrate, the measuring voltage includes measuring voltage across the p-n junction using electrodes coupled to a front side and a back side of the solar cell substrate.

Voltage is generated in a p-n junction by a process known as the photovoltaic effect. The collection of light generated carriers by the p-n junction causes a movement of electrons to the n-type side and a movement of holes to the p-type side of the junction. If the light generated carriers are prevented from leaving the solar cell, however, then the collection of light generated carriers causes an increase in the number of electrons on the n-type side of the p-n junction and a similar increase in holes in the p-type material. This separation of charge creates an electric field at the junction, which is in opposition to that already existing at the junction, thereby reducing the net electric field. Because the electric field represents a barrier to the flow of a forward biased diffusion current, the reduction of the electric field increases the diffusion current. A new equilibrium is reached in which a voltage exists across the p-n junction. The greater amount of light energy (photons) absorbed, the greater will be the voltage across the p-n junction. This voltage is then measured using electrodes 60 and this is done at multiple or all wavelengths in the range of wavelengths used for illumination, to produce a voltage-wavelength correlation such as shown in FIGS. 5 and 6.

Figure 5:
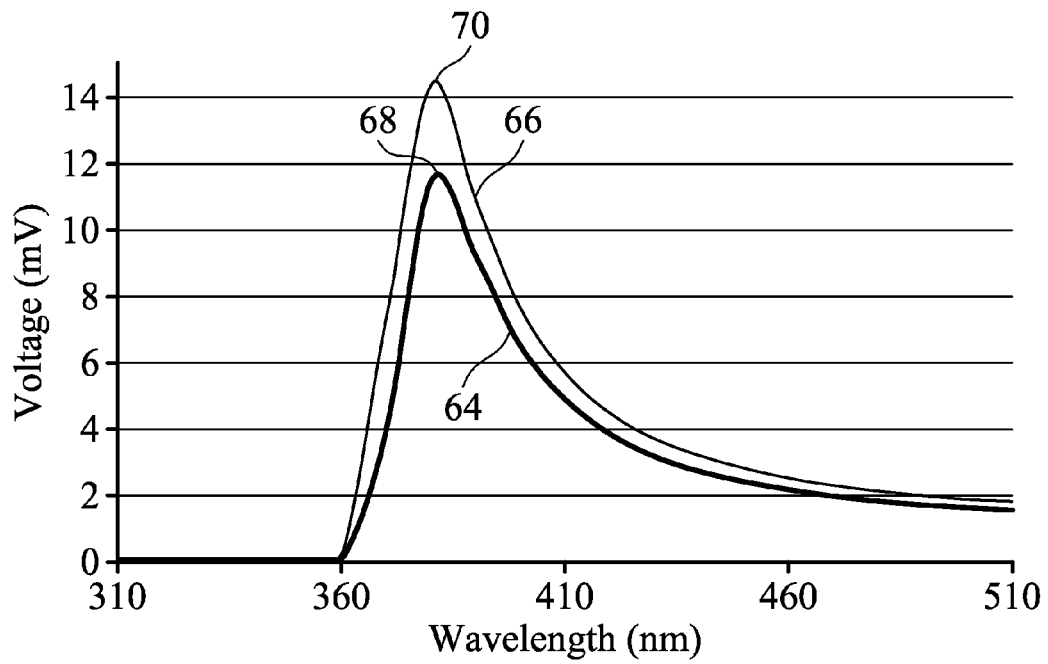
FIG. 5 is an embodiment of a plot of voltage versus wavelength for light absorbed in two samples, in accordance with some embodiments.

FIG. 5 shows two correlation curves. Correlation curve 64 is representative of one sample and correlation curve 66 is indicative of another sample. In each case, the correlation curve 64, 66 represents a voltage reading (see above) as a function of wavelength of light for a sample having a substrate material with a junction or interface below its surface. Correlation curve 64 includes peak voltage location 68 and correlation curve 66 includes peak voltage location 70. Peak voltage location 68 of correlation curve 64 lies at a particular wavelength location along the X axis. For correlation curve 64, peak voltage location 68 appears to be at about a wavelength of 380-385 nm. According to aspects of the disclosure, this wavelength of 380-385 nm is then referenced on an associated penetration depth versus wavelength correlation for the same material such as shown in FIG. 3 and the penetration depth associated with a wavelength of about 380-385 nm, is identified as the junction depth of a p-n junction beneath surface 14 of substrate material 2. The intensity of the voltage at peak voltage locations of the correlation curves is directly related to carrier concentration. In general, voltage is directly related to carrier concentration. As such, the intensity of the voltage at peak voltage location 68 of correlation curve 64 is related to carrier concentration for the sample indicted by correlation curve 64.

The same analysis is done for correlation curve 66, which is representative of a different sample. The intensity of the voltage at peak voltage location 68 of correlation curve 64 is indicative of a lower carrier concentration by about (−17%) as compared to location 70 of correlation curve 66 as the height of the voltage signal at location 68 is about 17% less than the voltage at location 70.

Figure 6:
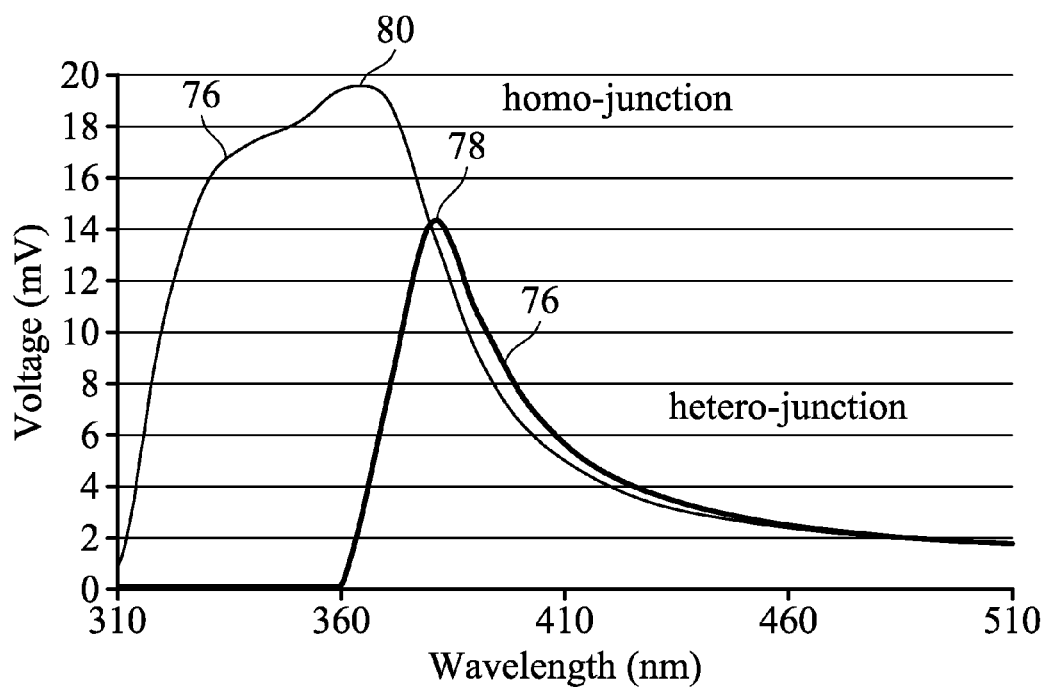
FIG. 6 is an embodiment of a plot of voltage versus wavelength for light absorbed in two samples, in accordance with some embodiments.

FIG. 6 shows two other correlation curves, 74 and 76 for which the same analysis can be done. Correlation curve 74, like the two correlation curves 64, 66 of FIG. 5, is indicative of a hetero-junction, whereas correlation curve 76 is indicative of a homo-junction. The difference between a homo-junction and a hetero-junction is the material absorption, i.e. band gap and absorption coefficient. The sharpness of the voltage signal is related to the carrier concentration in the material and the hetero-junction, as represented by correlation curve 74, produces a sharper voltage signal curve. Correlation curve 74 includes peak voltage location 78 and correlation curve 66 includes peak voltage location 80. In each case the location of the peak voltage 78, 80 along the x-axis is associated with a wavelength and the wavelength can then be used to identify the junction depth by referring to an associated wavelength—penetration depth correlation for the material being analyzed and identifying the penetration depth associated with the wavelength. This penetration depth is the junction depth of the p-n junction below surface 14 of substrate material 2. In each case the voltage intensity at peak voltage 78, 80 is related to carrier concentration.

Figure 7:
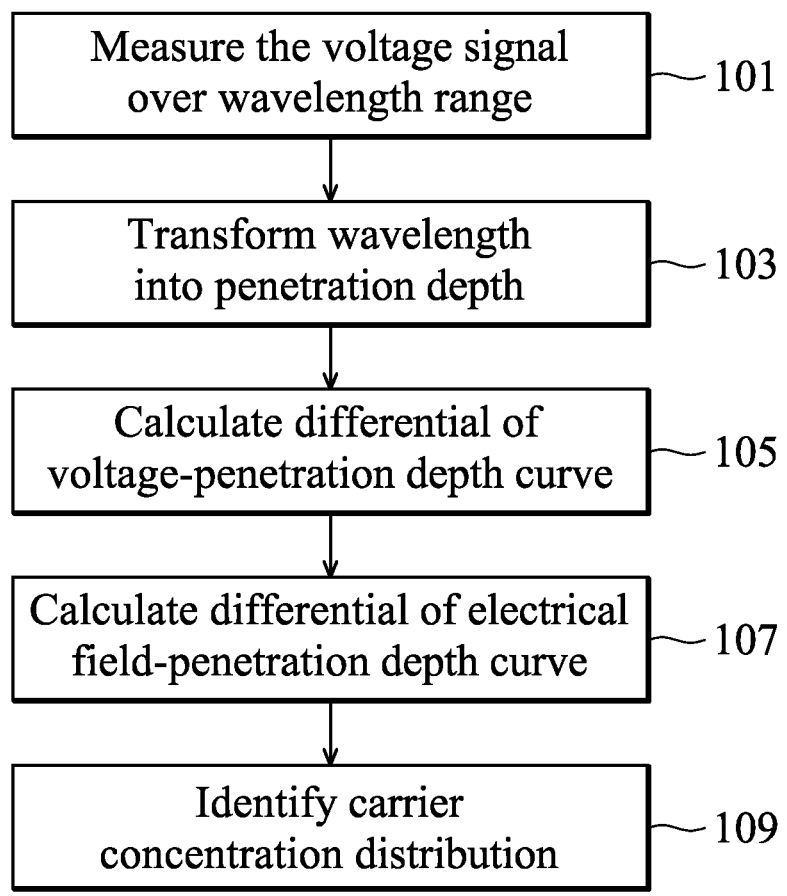
FIG. 7 is a flowchart showing a method in accordance with some embodiments of the disclosure.

FIG. 7 is a flowchart showing steps of a method according to various embodiments of the disclosure. At step 101, a voltage signal is generated by measuring voltage over a range of wavelengths, as described above. The range of wavelengths may lie within the range of ultraviolet to infrared radiation in various embodiments, and will vary according to the substrate material being analyzed. According to some embodiments, a correlation between voltage and wavelength is produced and in some embodiments, this correlation is plotted or represented graphically.

At step 103, the wavelength of light associated with the peak voltage in the voltage-wavelength correlation of step 101, is identified and associated with a penetration depth using methods described above. At step 105, the differential of the voltage—penetration depth curve generated in step 101, is calculated. The term differential refers to an infinitesimal (infinitely small) change in the voltage—penetration depth curve and can be denoted dV or ΔV to denote the change in the value of V, voltage. The differential dV is interpreted as infinitesimals and represents an infinitely small change in the voltage variable. Several methods of determining such infinitesimals rigorously are available and are used in various embodiments.

At step 107, an electric field-penetration depth curve is established by the differential of the voltage penetration depth curve. The electric field is expressed in V/distance and is generated using the equation of $E(x)=-dV(x)/dx$, where x is the depth, i.e. thickness of the absorber layer. In this manner, the electrical field-penetration depth curve can be obtained using thickness of the absorber layer. Also at step 107, the differential of the electrical field-penetration depth curve is calculated. The differential d[E-field] represents an infinitely small change in the variable electrical field-penetration depth curve. At step 109, the carrier concentration distribution is calculated using the differential of electrical field-penetration depth curve. In an embodiment, the following equations are used to describe the carrier concentration distribution $C_1$ and $C_2$:

$$E(x) = \begin{cases} \int -\frac{qN_A}{\varepsilon} dx = -\frac{qN_A}{\varepsilon} x + C_1, & \text{for } -x_p \le x < 0 \\ \int \frac{qN_D}{\varepsilon} dx = \frac{qN_D}{\varepsilon} x + C_2, & \text{for } 0 \le x < x_n \end{cases}$$

$$E(x = -x_p) = 0 \implies C_1 = \frac{-qN_A}{\varepsilon} x_p$$

$$E(x = x_n) = 0 \implies C_2 = -\frac{qN_D}{\varepsilon} x_n$$

in which $-\varepsilon$ is the permittivity in the semiconductor material and $-x_p$ and $x_n$ are the edges of the depletion region in the p- and n-type side semiconductor respectively, measured from the physical junction between the two materials.

In some embodiments, a metrology method for identifying a junction depth in a material, is provided. The method comprises establishing a first correlation between wavelength of light and penetration depth of light in a material, in a first illumination process; providing a layer of the material having a junction beneath a surface thereof; directing light from an illumination source into the layer through the surface in a further illumination process, the light including a chosen range of wavelengths of light; measuring voltage induced by the light in the further illumination process, as a function of wavelength of the light, thereby establishing a second correlation between the measured voltage and wavelength of light from the illumination source; and identifying a depth of the junction beneath the surface, based on the second correlation.

In some embodiments, a metrology method for identifying a junction depth in a material, is provided. The method comprises: first establishing a correlation between wavelength of light and penetration depth of light in a material; providing a substrate of the material, the substrate having a junction beneath a surface thereof; directing a range of wavelengths of light from an illumination source into the substrate through the surface thereby inducing measurable voltages at the junction for each wavelength of the range of wavelengths of light; measuring at least some the measurable voltages throughout the range of wavelengths of light; identifying a peak voltage of the measured voltages; detecting a first wavelength associated with the peak voltages; and identifying a depth associated with the peak voltage and the first wavelength using the correlation, the depth being a penetration depth associated with the first wavelength in the correlation.

In some embodiments, a metrology method for identifying a junction depth in a solar cell, is provided. The method comprises: establishing a first correlation between wavelength of light and penetration depth of light in a material by measuring transmittance at various wavelengths of the light, in the material; providing a solar cell substrate including a structure of the material, the structure of the material having a p-n junction beneath a surface thereof; directing a range of wavelengths of light from an illumination source into the structure of the material through the surface thereby inducing measurable voltages across the p-n junction for each wavelength of the range of wavelengths; measuring at least some the measurable voltages throughout the range of wavelengths of light thereby establishing a second correlation between the measured voltages and wavelength of light; identifying a peak voltage of the measured voltages; identifying a first wavelength associated with the peak voltage using the second correlation; identifying a depth associated with the peak voltage and the first wavelength using the first correlation, the depth being a penetration depth associated with the first wavelength in the first correlation; and identifying a dopant concentration in the structure of the material based on the peak voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metrology method for identifying a junction depth in a material, said method comprising:
    establishing a first correlation between wavelength of light and penetration depth of light in a material, in a first illumination process;
    providing a layer of said material having a junction beneath a surface thereof;
    directing light from an illumination source into said layer through said surface in a further illumination process, said light including a chosen range of wavelengths of light;
    measuring voltage induced by said light in said further illumination process, as a function of wavelength of said light, thereby establishing a second correlation between said measured voltage and wavelength of light from said illumination source; and
    identifying a depth of said junction beneath said surface, based on said second correlation.

2. The metrology method as in claim 1, wherein said establishing a first correlation comprises carrying out a plurality of trials and measuring or calculating said penetration depth for a plurality of wavelengths of light.

3. The metrology method as in claim 1, wherein said directing light from an illumination source includes using a frequency modulator to modulate said light and said measuring voltage includes using an amplifier to amplify said voltage.

4. The metrology method as in claim 3, wherein said measuring voltage includes said amplifier being a lock-in amplifier that reduces background noise of said voltage.

5. The metrology method as in claim 1, wherein said junction comprises an MOS junction.

6. The metrology method as in claim 1, wherein said second correlation comprises a plot of said measured voltage versus said wavelength of light from said illumination source, and
    said identifying includes identifying a first wavelength associated with a peak voltage reading of said plot.

7. The metrology method as in claim 6, wherein said identifying further comprises associating said first wavelength with a penetration depth based on said first correlation.

8. The metrology method as in claim 6, wherein said identifying further comprises establishing said depth as a penetration depth associated with said first wavelength in said first correlation.

9. The metrology method as in claim 1, wherein said material comprises silicon and said establishing a first correlation includes using a range of wavelengths of light ranging from 200-1200 nm.

10. The metrology method as in claim 1, wherein said material comprises germanium and said establishing a first correlation includes using a range of wavelengths of light ranging from 200-1700 nm.

11. The metrology method as in claim 1, wherein said layer is a substrate material and said measuring voltage comprises measuring voltage across said junction using electrodes coupled to said substrate material on opposed sides of said junction.

12. The metrology method as in claim 1, wherein said layer comprises a solar cell substrate and said measuring voltage comprises measuring voltage across said junction using electrodes coupled to a front side and a back side of said solar cell substrate.

13. The metrology method as in claim 1, wherein said establishing a first correlation includes measuring light transmittance of said material.

14. The metrology method as in claim 1, wherein said junction is a p-n junction and further comprising identifying dopant concentration in said layer of said material.

15. The metrology method as in claim 14, wherein said identifying dopant concentration in said layer of said material includes identifying said dopant concentration in said layer of said material based on said measured voltage of said second correlation.

16. A metrology method for identifying a junction depth in a material, said method comprising:
    first establishing a correlation between wavelength of light and penetration depth of light in a material;
    providing a substrate of said material, said substrate having a junction beneath a surface thereof;
    directing a range of wavelengths of light from an illumination source into said substrate through said surface thereby inducing measurable voltages at said junction for each wavelength of said range of wavelengths of light;
    measuring at least some said measurable voltages as a function of wavelength of light, throughout said range of wavelengths of light;
    identifying a peak voltage of said measured voltages;
    detecting a first wavelength associated with said peak voltage; and
    identifying a depth associated with said peak voltage and said first wavelength using said correlation, said depth being a penetration depth associated with said first wavelength in said correlation.

17. The metrology method as in claim 16, wherein said measuring at least some said measurable voltages comprises measuring voltage across said junction using electrodes coupled to opposed sides of said junction.

18. The metrology method as in claim 16, wherein said junction is a p-n junction, said material comprises silicon and said directing a range of wavelengths of light comprises a range of wavelengths of light ranging from about 200-1200 nm.

19. The metrology method as in claim 16, wherein said material comprises germanium and said directing a range of wavelengths of light comprises a range of wavelengths of light ranging from about 200-1700 nm.

20. A metrology method for identifying a junction depth in a solar cell, said method comprising:
    establishing a first correlation between wavelength of light and penetration depth of light in a material by measuring transmittance at various wavelengths of said light, in said material;

providing a solar cell substrate including a structure of said material, said structure of said material having a p-n junction beneath a surface thereof;

directing a range of wavelengths of light from an illumination source into said structure of said material through said surface thereby inducing measurable voltages across said p-n junction for each wavelength of said range of wavelengths;

measuring at least some said measurable voltages throughout said range of wavelengths of light thereby establishing a second correlation between said measured voltages and wavelength of light;

identifying a peak voltage of said measured voltages;

identifying a first wavelength associated with said peak voltage using said second correlation;

identifying a depth associated with said peak voltage and said first wavelength using said first correlation, said depth being a penetration depth associated with said first wavelength in said first correlation; and identifying a dopant concentration in said structure of said material based on said peak voltage.

* * * * *